United States Patent [19]

Laviron

[11] Patent Number: 4,713,606
[45] Date of Patent: Dec. 15, 1987

[54] SYSTEM FOR TESTING THE FAILURE OR SATISFACTORY OPERATION OF A CIRCUIT HAVING LOGIC COMPONENTS

[75] Inventor: André Laviron, Fontaine les Dijon, France

[73] Assignee: Commissariat a l'Energie Atomique, Paris, France

[21] Appl. No.: 751,328

[22] Filed: Jul. 2, 1985

[30] Foreign Application Priority Data

Jul. 18, 1984 [FR] France .................. 84 11388

[51] Int. Cl.$^4$ ................ G01R 31/28; G06F 15/00
[52] U.S. Cl. ......................... 324/73 R; 364/578
[58] Field of Search ........... 324/73 R, 73 PC, 73 AT; 364/578

[56] References Cited

U.S. PATENT DOCUMENTS 4,520,309 5/1985 Laviron et al. ............... 324/73 R

FOREIGN PATENT DOCUMENTS 0060194 9/1982 European Pat. Off. .

Primary Examiner—Ernest F. Karlsen
Attorney, Agent, or Firm—Oblon, Fisher, Spivak, McClelland, & Maier

[57] ABSTRACT

The invention relates to a system for testing the failure or satisfactory operation of a logic component circuit.

The system comprises a generator, whose outputs are respectively connected to the simulation inputs of the components, in order to apply thereto simulation signals having a first or a second logic state, as well as testing means connected to the output of the circuit and able to mark the logic level of the output signal of said circuit. The testing means comprise a counter having an input for loading a predetermined value corresponding to the number of components to be simulated in the testing circuit, as well as another counter connected to the outputs of the generator for receiving a resetting signal and incrementation pulses. These means also comprise means for marking the logic level of the output signal of the circuit. Application to the testing of circuits having logic components.

2 Claims, 7 Drawing Figures

SYSTEM FOR TESTING THE FAILURE OR SATISFACTORY-OPERATION OF A CIRCUIT HAVING LOGIC COMPONENTSg

BACKGROUND OF THE INVENTION

The present invention relates to a system for testing the failure or satisfactory operation of a circuit having logic components, in which n components form a system of components marked 1 to n in a predeterinned manner. These components are interconnected, so that on one output the system has a logic state dependent on the failure or satisfactory operation state of the system and which is dependent on the failure or satisfactory operation state of each of the n components of the system. Each of the components of the system has at least one simulation input able to receive a signal simulating the failure or satisfactory operation of this component.

This test system can permit the study of electronic circuit incorporating a plurality of logic components, but by analogy, it can permit the study of the failure or satisfactory operation of e.g. a hydraulic circuit, whereof one or more components can be in the failure or satisfactory operation state. In this case, the hydraulics circuit is replaced by an electronic circuit having a plurality of logic components, whose operation is equivalent, by analogy, to that of the corresponding components of the hydraulic circuit.

In general, a circuit constituted by logic components has an output, whose logic state is dependent on the failure or satisfactory operation state of each of its components. As stated hereinbefore, said circuit can either be a real circuit, or a circuit simulating a circuit to be studied. Each of the components generally has an input connected to an output of another component of the circuit and an input which can receive a signal simulating the failure or satisfactory operation of said component.

The systems making it possible to test circuits of this type are generally complicated and costly, whilst being difficult to put into effect. They are generally constituted by a computer, which is connected to the circuit to be tested via an interface specific to each circuit. This type of system requires a special processing program for each circuit, so that the tests carried out can take a long time.

In the testing of circuits constituted by logic components, the Expert is accustomed to using a certain number of terms, as indicated below.

The section of a circuit consists of all the marks of the defective components of said circuit, such that if all the components are defective, the circuit is defective, whilst the other components of the circuit not forming part of the section operates satisfactorily.

The link of the circuit consists of all the marks of the satisfactorily operating components of the circuit, such that if all the components are operating satisfactorily the circuit operates in a satisfactory manner, all the other components of the circuit not forming part of the link being defective.

The order of a section or link is constituted by the number of marks of the so respectively defective or satisfactorily operating components describing the section or link.

The minimum section is a section such that it is impossible to find another configuration, by eliminating one or more defective elements from among those whose marks describe the section and which would make it possible to maintain the circuit in a defective state.

A minimum link is a link such that it is impossible to find another configuration by eliminating one or more satisfactorily operating components from among those whose marks describe the link and would make it possible to maintain the circuit in a state of satisfactory operation.

The minimum section with respect to the preceding order is a section such that it is not possible to find another configuration of said section by eliminating a single defective component from among those whose marks describe the section, whilst maintaining the circuit in a defective state.

In the same way, a minimum link with respect to the preceding order is a link such that it is not possible to find another configuration of said link by eliminating a single component which is operating satisfactorily from among those whose marks describe the link, whilst maintaining the circuit in a state of satisfactory operation.

When all the components describing a section of a circuit are defective, the circuit is defective.

This is followed by the definition of a critical failure state of a circuit, one or more critical components in a critical failure state, as well as a critical section.

The critical failure state of a circuit or a system is a failure state thereof, such that there is at least one component describing a section of said circuit or system which, when it is marked returns the circuit to a satisfactory operation state.

A critical component of a critical failure state is a component describing the corresponding section and which, when it is marked, makes it possible to restore the circuit to a state of satisfactory operation (said component being the only one to be marked at a given time).

It is pointed out that there can be several critical components for the same section and that a failure state corresponding to a section only containing critical components makes it possible to deduce that the section is minimal compared with the preceding order.

A critical section is a section corresponding to a critical failure state of the circuit or system. In the same way, it is possible to define a state of critical satisfactory operation of a system or circuit, one or more critical components in a critical failure state, as well as a critical link. The state of critical satisfactory operation of a circuit or system is a satisfactory operation state of said circuit or system, such that there is at least one component describing a link thereof which, when it is brought into the failure state, places the circuit or system in a failure state. A critical component of a state of critical satisfactory operation of a circuit or system is consequently a component describing a link of said circuit or system which, when it is brought into the failure state, makes it possible to bring the circuit into the failure state (said component being the only one to be brought into the failure state at a given time).

It is pointed out that there can be several critical components for the same links and that a satisfactory operation state corresponding to a link only containing critical components makes it possible to deduce that the link is minimal with respect to the preceding order. A critical link is one which corresponds to a critical satisfactory operation state of the circuit or system.

Finally, it is possible to define an incoherent circuit or system, i.e. a circuit or system in which it is possible to find failure states, such that by adding one or more defective components to said circuit or system, the latter is brought into a satisfactory operating state. The component is then called non-coherent or incoherent.

Apart from the disadvantages referred to hereinbefore (cost, complexity, difficulty in putting into effect), the known testing systems do not make it possible in a simple manner to determine whether a section or link is minimal with respect to the preceding order. Also, only the system described in French patent application Ser. No. 8,104,868, filed on Mar. 11th 1981 in the name of the present Applicant, makes it possible to determine whether a section or link is minimal with respect to the preceding order in the case of very complex systems.

This system as well as the other known systems which more particularly use computers, do not make it possible to determine a critical satisfactory operation or failure state for complex systems, if a section or link is critical and no matter what the critical component or components in said critical section or link. In addition, these systems do not make it possible to establish whether a circuit or system for complex systems is incoherent and which is or are the incoherent component or components.

SUMMARY OF THE INVENTION

The object of the present invention is to obviate these disadvantages by providing a system making it possible to perform tests in a rapid, simple, inexpensive and effective manner on circuits for which a section or link has been determined and for which an investigation is made as to whether said circuit or link is critical and which is or are the critical component or components in said section or link. The invention also makes it possible to determine whether a circuit or system is incoherent.

The present invention therefore specifically relates to a system for testing the failure or satisfactory operation of a circuit having logic components, in which n components form a system of components marked 1 to n in a predetermined manner and interconnected so that said system has on one output a logic state corresponding to the failure or satisfactory operation state of the system and which depends on the failure or satisfactory operating state of each of the n components of the system, each of the n components of the system having at least one simulation input able to receive a signal simulating the failure or satisfactory operation of said system, comprising:

a generator whose outputs are respectively connected to the simulation inputs of the components, in order to apply thereto simulation signals having a first or a second logic state making it possible to bring one or more components respectively into the failure or satisfactory operation state and then conversely and reciprocally bringing said component or components into a satisfactory operation or failure state, for one or more combinations from among the n components of the system;

testing means connected to the output of the system and able to mark the logic level of the output signal of the system;

wherein the test means comprise:

a counter having an input for loading a predetermined value corresponding to numbers of components to be simulated in the tested circuit, said counter having another input connected to the output of the generator supplying an initialization signal on initializing the generator, and another input connected to an output of the generator for receiving a control pulse, the said pulse controlling the countdown of said counter, an output of said counter being connected to a stop control input of the generator for stopping the latter when all the components have been simulated;

another counter connected to an output of the generator for receiving a resetting signal, on initializing the generator and another input connected to the generator output and which supplies each control pulse, said pulse controlling the incrementation of the counter content;

means for making the logic level of the output signal of the system, said marking means being connected to the system output and to an output of the generator supplying a synchronizing signal for each new combination of simulation signals, and to an output of said counter for marking the member of any component for which the change of logic level of the simulation signal applied thereto brings about a change of level of the output signal of the system.

According to another feature, the marking means comprise an AND gate with an inverted input connected to the output of the system, and another input connected to the output of the generator supplying said synchronizing signal, and a number display means, whereof one input is connected to the output of the AND gate and whereof another input is connected to the output of said other counter.

According to another feature, in a system of components for which the generator supplies signals, whose logic level corresponds to the failure of these components and for which the output signal of the system has a logic level corresponding to the failure of said system, said generator then successively supplying to each component a signal, whose logic level corresponds to its satisfactory operation, the display means indicating the number or numbers of so-called critical components for which the simulation of a satisfactory operation brings about a change in the level of the output signal of the system, which then corresponds to the satisfactory operation of the system.

According to another feature, in a system of components for which the generator supplies signals, whose logic level correponds to the satisfactory operation of these components and for which the output signal of the system has a logic level corresponding to the satisfactory operation of said system, said generator then successively supplying to each component a signal, whose logic level corresponds to its failure, the display means indicating the number or numbers of so-called critical components for which the simulation of a failure brings about a change in the level of the output signal of the system, which then corresponds to the failure of the system.

According to another feature, in a system of components for which the generator supplies to certain of the components, signals whereof the logic level corresponds to the failure of these components and for which the output signal of the system has a logic level corresponding to the failure of said system, said generator then supplying to one or other components of the system, a signal whose logic level also corresponds to their failure, the display means indicating the number or numbers of said incoherent other component or components for which the simulation of a failure brings about a change of level of the output signal of the system, which then corresponds to the satisfactory operation of the system.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1A:
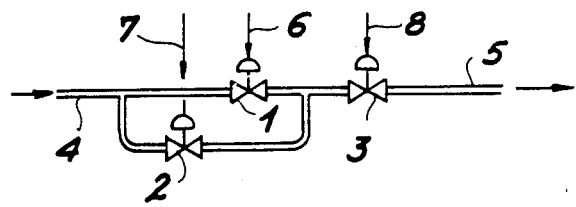
FIG. 1A diagrammatically a hydraulic circuit, whose failure or safisfactory operation state is to be studied in the case of a failure or satisfactory operation of one or several of its components, making it possible to better understand the definitions of a section and a link.

FIG. 1A diagrammatically shows a hydraulic circuit, which e.g. makes it possible to establish the circulation between an upstream line 4 and a downstream line 5, by means of three pneumatic valves 1, 2, 3, whereof the opening or closing can be controlled by the presence of absence of compressed air in control circuits 6, 7, 8. In this circuit, the valves constitute the only components which can either be in a failure state, or a satisfactory operation state. The hydraulic circuit in question is defective if the fluid is not passed into the downstream line 5. When only valves 1 and 2 are defective, the fluid no longer passes from the upstream line 4 to the downstream line 5. The same applies when valves 1 and 3 are defective. Thus, all the marks 1 and 2 constitute a section and the same applies with regards to all the marks 1 and 3. In this circuit, according to the definitions given hereinbefore, the section constituted by marks 1 and 2 (gates $ET_1$, $ET_2$) is a section of order 2, which also applies with regards to section 1, 3. Section 1,2 is minimal, because on restoring component 1 to a satisfactory operation condition, the system again functions satisfactorily. The same applies for component. As will be shown hereinafter, these components are critical components. However, section 1,3 is not critical, because on restoring component 1 to satisfactory operation, the system remains defective.

When only valves 1 and 3 are in a satisfactory operating state, the fluid passes from upstream to downstream, so that all the marks 1 and 3 constitute a link. This link is also a minimum link or order 2, because it is impossible to find another configuration on eliminating the satisfactory operation of one of these valves, which makes it possible to maintain the circuit in a state of satisfactory operation. As will be shown hereinafter, components 1, 3 are critical components.

Figure 1B:
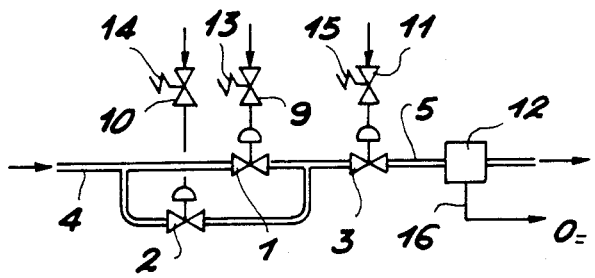
FIG. 1B diagrammatically, the circuit of FIG. 1A, to which have been added to each of the circuit components, means making it possible to simulate the failure or satisfactory operation of each of the components.

FIG. 1B diagrammatically shows the circuit of FIG. 1A, to which have been added, for each of the valves 1, 2, 3 on control lines 6, 7, 8 thereof, means 9, 10, 11 making it possible to simulate the failure or satisfactory operation state of these valves. A fluid passage detector 12 can be positioned on the upstream line 5 to indicate for example, by a logic state 0 on its output 16, the failure of the hydraulic circuit, when a fluid supplied to the upstream line 4 does not appear in the downstream line 5. Means 9, 10 and 11 making it possible to simulate the failure of the valves corresponding thereto respectively have control inputs 13, 14, 15. These means are respectively constituted e.g. by an electric control valve acting on the pneumatic controls of each of the circuit valves 1, 2, 3. The control input of each of these electric control valves acts in such a way that if a voltage is applied to said input, the valve closes and cuts off the compressed air supply entering the control line of the corresponding valve of the hydraulic circuit. This simulates the failure of the corresponding valve in the circuit. As this failure has been simulated, it is there merely necessary to observe the output signal of the fluid passage detector 12 to know whether said failure does or does not interrupt the passage for fluid to the output of the hydraulic circuits.

Figure 2A:
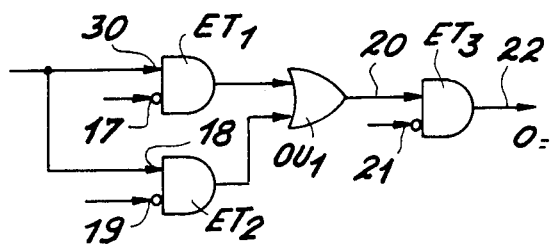
FIG. 2A a logic circuit equivalent to the hydraulic circuit of FIG. 1B and making it possible to study the sections of said circuit.

FIG. 2A shows a logic circuit equivalent to the hydraulic circuit of FIG. 1B. This equivalent circuit makes it possible to study the sections and particularly the critical sections of the hydraulic circuit, i.e. its response to simulated failures. In this equivalent circuit, valve 1 and also the electric control valve 9 making it possible to simulate the failure of valve 1 are replaced by gate $ET_1$, a direct input 30 of said gate being brought to a logic level 1 for simulating the entry of fluid into the upstream line of the hydraulic circuit and an inverted simulation input 17 is brought to logic state 1 for simulating the failure of said circuit. In the same way, gate $ET_2$ is equivalent to the valve 2 associated with the electric control simulation valve 10. A logic level 1 state on input 18 of said gate simulates the passage of fluid, whilst a logic level 1 state on the inverted simulation input 19 simulates the failure of said gate. Finally, gate $ET_3$ is equivalent to valve 3 and to the electric control simulation valve 11. The direct input 20 of said gate, brought to logic level 1state, simulates the passage of the fluid, whilst the inverted simulation input 21 brought to logic state 1 simulates the failure of said gate. Gate $OU_1$ is equivalent to the junction between the outputs of valves 1 and 2. This circuit equivalent to the hydraulic circuit of FIG. 1B is considered to be in the failure state when the output 22 of gate $ET_3$ is at logic level 0. Thus, as a result of this equivalent circuit, it is possible to study the sections of the hydraulic circuit shown in FIG. 1B in a much simpler manner. For example, gates $ET_1$ and $ET_2$ are equivalent to the valves 1 and 2 defining a section.

This section is critical, because it defines a critical failure state. Thus, if valve 1 or 2 is brought into a state of satisfactory operation, so is the hydraulic circuit. Thus, valve 1 is a critical component as is valve 2. This section which has no critical components is of a minimum nature.

The section constituted by valves 1 and 3 also defines a crtical failure state. Thus, the circuit is brought into a satisfactory operation state in valve 3 which is brought into such a state. Thus, valve 3 is a critical component. However, valve 1 is not a critical component, because its bringing into a satisfactory operation state does not change the failure state of the circuit. It can therefore be said that the section constituted by valves 1 and 3 is a critical section, because it defines a critical failure state, but this section is not of a minimum nature.

The critical sections and critical components of these sections can be investigated easily using equivalent logic circuits, of the type used in FIG. 2A, by applying logic level 1 signals to the simulation inputs of the gates corresponding to the components whose failure is to be simulated, as well as logic level 0 signals to the simulation inputs of gates corresponding to the components, relative to which it is wished to simulate the satisfactory operation or instantaneous return to a satisfactory operating state.

Figure 2B:
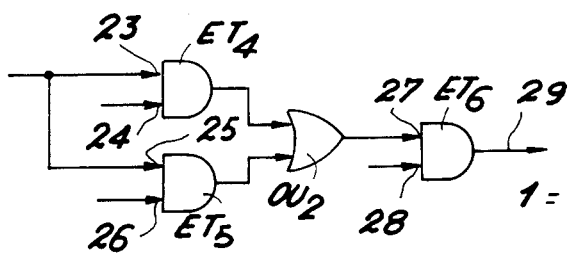
FIG. 2B a logic circuit equivalent to the hydraulic circuit of FIG. 1B and making it possible to study the links of said circuit.

The circuit of FIG. 2B is a logic circuit equivalent to the hydraulic circuit of FIG. 1B and makes it possible to study the links of said circuit. In the same way as hereinbefore valves 1, 2, 3, as well as their simulation control valves 9, 10, 11, which are electrically controlled, are respectively replaced by $ET_4$, $ET_5$ and $ET_6$ gates. Gate $OU_2$ represents the junction between the outputs of valves 1 and 2. As hereinbefore, gates $ET_4$, $ET_5$ and $ET_6$ have inputs 23, 25, 27 which, when they are brought to logic level 1, simulate the passage of the fluid into the hydraulic circuit. The simulation inputs 24, 26, 28 of these gates make it possible to simulate the satisfactory operation of each of the valves, when they are brought to logic level 1. When the circuit is in a satisfactory operating state, output 29 of gate $ET_6$ is at logic level 1. Thus, this logic circuit equivalent to the hydraulic circuit of FIG. 1B makes it possible to study the links of this hydraulic circuit, i.e. its satisfactory operating state, as a function of the state of satisfactory operation of each of its components.

In the circuit of FIG. 2B, gates $ET_4$ and $ET_6$ are equivalent to valves 1 and 3 defining a link. This link is critical, because it defines a critical state of satisfactory operation. Thus, if valve 1 or valve 3 is brought into a failure state, circuit is brought into a failure state, because valve 2, which does not form part of the link, is already in a failure state. Valve 1 or valve 3 is a critical component of the critical link. This link which only has critical components is a minimum link.

The investigation of critical links and critical components of these links can therefore easily be carried out with the aid of equivalent logic circuits of the type used in FIG. 2B, by applying logic level 1 signals to the simulation inputs of gates corresponding to the components of the circuit or system, whose satisfactory operation is to be simulated, together with logic level 0 signals to the simulation inputs of gates corresponding to the components, whereof it is wished to simulate the failure or instantaneous bringing into a failure state. Obviously, so as to be in accordance with the logic defined in FIG. 2A, the output of gate $ET_6$ must be followed by a not shown inverter to ensure that the satisfactory operation corresponds to a logic level 0.

Figure 2C:
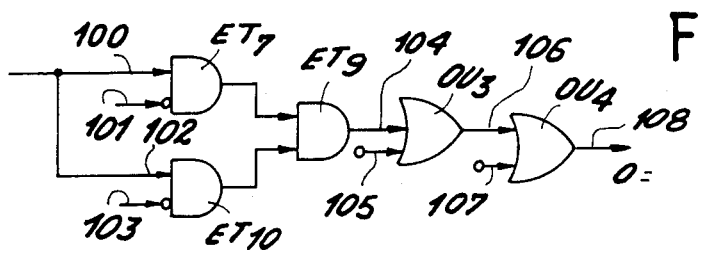
FIG. 2C diagrammatically an example of an incoherent circuit.

FIG. 2C provides a better understanding of what is a non-coherent or incoherent circuit or system. The logic circuit shown therein can be a circuit equivalent to an e.g. hydraulic or any other type of system or circuit.

This logic circuit comprises gates $ET_7$, $ET_{10}$, $ET_9$, $OU_3$, $OU_4$. Gate $ET_7$ comprises an input 100, which is permanently brought to logic level 1, whilst its other inverted simulation input 101 can be brought to a logic level 1 or a logic level 0 for simulating the failure or satisfactory operation of the component to which said gate corresponds in the circuit or system to be studied.

Gate $ET_{10}$ comprises an input 102 permanently brought to a logic level 1, whilst its other inverted simulation input 103 is brought to a level 1 or a logic level 0 to simulate the failure or satisfactory operation of the component to which said gate corresponds in the circuit or system to be studied.

The outputs of gates $ET_7$ and $ET_{10}$ are respectively connected to the inputs of gate $ET_9$.

Gate $OU_3$ comprises one input 104 connected to the output of gate $ET_9$ and another input 105 which can be brought to a logic level 1 or a logic level 0 for simulating a breakdown or failure of the corresponding component for the satisfactory operation of said component. Finally, gate $OU_4$ comprises an input 106 connected to the output of gate $U0_3$, together with another input 107 which can be brought to a logic level 1 or to a logic level 0 for simulating a failure or satisfactory operation of the corresponding component.

In this example of simulation circuits, it is possible to show whether the circuit is in a failure state (logic level 0 signal on output 108 of gate $OU_4$) as a result of the simulated failure of certain components, the bringing into the simulated failure state of components which were in a satisfactory operating state leading to the bringing into a satisfactory operating state of the system.

If, for example, a failure is simulated by applying a logic level 1 signal to input 101 of gate $ET_7$, whereas all the other components are in a satisfactory operating state (logic level 0 signals on the simulation inputs 103, 105, 107), output 108 of gate $OU_4$ is at logic level 0 indicating a failure. If a failure is then simulated by applying a logic level 1 signal to input 105 of gate $OU_3$ or to input 107 of gate $OU_4$ for simulating a failure state of the corresponding components, output 108 of gate $OU_4$ passes to logic level 1, thus indicating a return to a state of satisfactory operation of the simulated system or circuit, which is incoherent.

The same applies if a failure is simulated on inputs 101 and 103 of gates $ET_7$, $ET_{10}$ by applying a logic level 1 signal to these inverted inputs, whilst the other inputs 105 and 107 receive logic level 0 signals simulating a satisfactory operation of corresponding components. Output 108 of gate $OU_4$ is at logic level 0 indicating the failure of the simulated system.

If a failure of components corresponding to one of the gates $OU_3$ or $OU_4$ is then simulated by applying a logic level 1 signal to input 105 or to input 107 of one or other of these gates, the signal on output 108 passes to logic level 1, thus indicating a return to the satisfactory operating state of the simulated system or circuit, which is still incoherent.

In the latter example, if gate $ET_7$ e.g. simulates a component numbered 1 of a system and if gate $ET_{10}$ simulates a component numbered 2, gates $OU_3$ and $OU_4$ simulating components numbered 3 and 4 respectively, it is possible to say that components 1,2 describe a section and that component 4 is incoherent for section 1,2.

As will be shown hereinafter, the testing system according to the invention makes it possible to apply to each of the satisfactory operation or failure simulation inputs of the components of a simulation circuit, logic level 1 or 0 signals. On one of its outputs, it also makes it possible to check whether in the simulated system, there is at least one critical section or link. It also makes it possible to mark the critical component or components of each section and each link. Finally, this testing system makes it possible to indicate whether a system or circuit is incoherent and which is the incoherent component in the section of said circuit.

Figure 3:
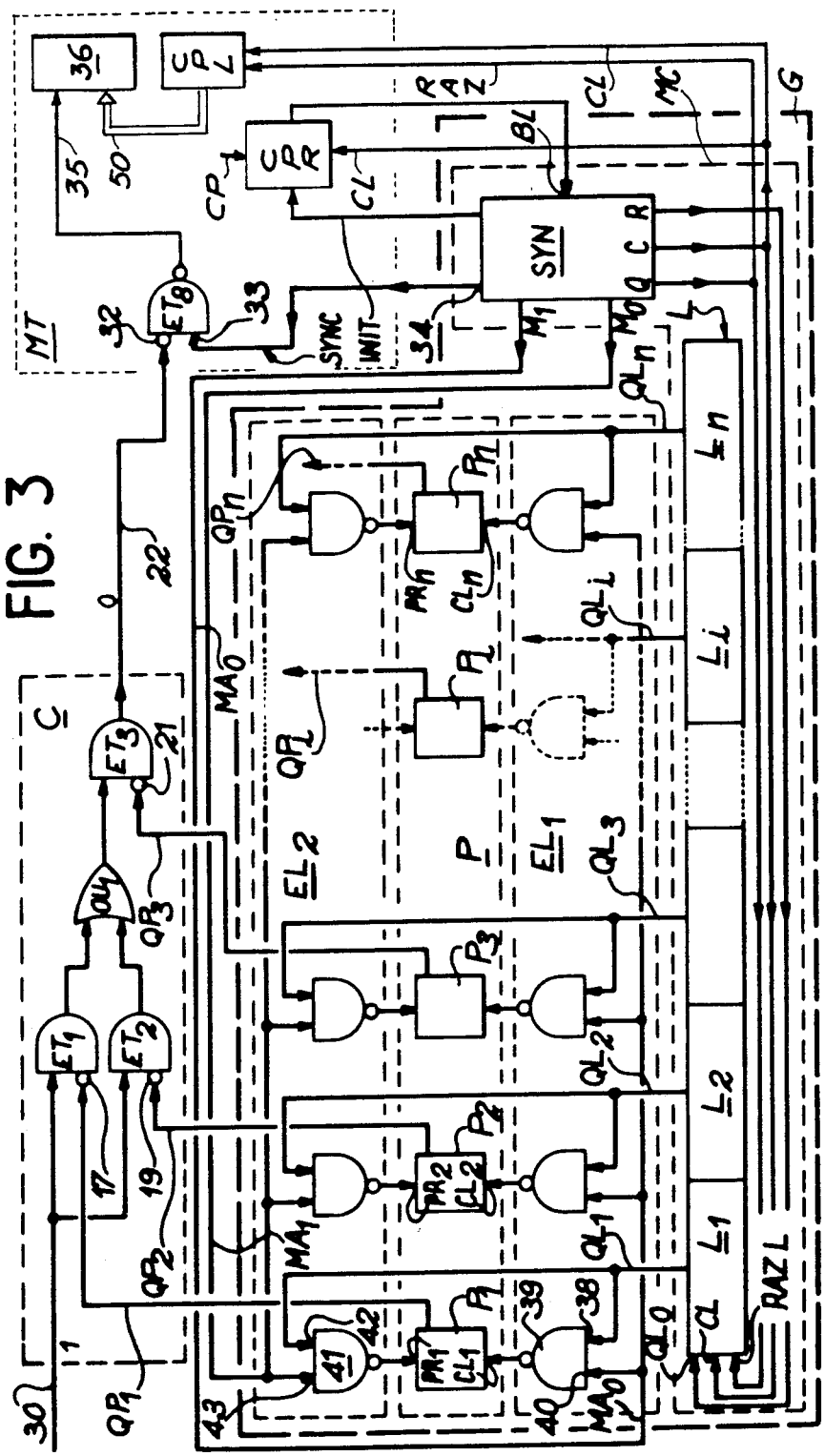
FIG. 3 diagrammatically, the system according to the invention and making it possible to study a critical section or critical link, as well as an incoherent system or circuit.

FIG. 3 diagrammatically shows a system for testing for the failure or satisfactory operation of a circuit C with n logic components, marked 1 to n in a predetermined manner. Circuit C represented in exemplified form is the same as that of FIG. 2A. This circuit is equivalent to the circuit of FIG. 1B and makes it possible to study the sections of said circuit. The components which it makes it possible to simulate are constituted by gates $ET_1$, $ET_2$ and $ET_3$. As indicated hereinbefore, input 30 of this circuit is brought to a logic level 1 for simulating the passage of the fluid into the corresponding hydraulic circuit. The output of this circuit is represented at 22, whilst the simulation inputs of the different components are designated 17, 19, 21. The presence of a logic level 0 on output 22 of said circuit indicates the failure thereof.

It is obvious that in the example of circuit C shown therein, the system according to the invention makes it possible to test sections and more particularly critical sections on a circuit constituted by three components, but it could also make it possible to test critical sections on a circuit having a number n of components which is well above 3.

It is also obvious that other components assumed to be non-defective in the investigation can be simulated in circuit C, this e.g. being the case with gate $OU_1$. With circuit C, as described, several sections can be investigated. For example, the sections simulating a failure of inputs 17, 19, 21, or the section simulating a failure of input 17, 19, or the section simulating a failure on input 21, of the section simulating a failure on inputs 17, 19, etc.

Finally, this system as described in its application to the testing of components of a section and more particularly a critical section in a circuit, like that of FIG. 2, can be applied in the same way to the testing of the components of a link and more particularly a critical link in a circuit like that of FIG. 2B.

It can also be used for determining incoherent components in a section or link or a circuit like that of FIG. 2C. The testing system shown in FIG. 4 comprises a logic level 0 or 1 signal generator G available on outputs $QP_1$, $QP_2$... $QP_i$... $QP_n$.

The testing system also comprises testing means MT connected to the inputs and outputs of generator G, for testing the logic level of the signal on the output of the tested circuit C for different configurations of the logic level 1 or 0 signals applied to the simulation inputs of the circuit C for simulating a circuit or system. These different configurations make it possible, as will be shown hereinafter, to determine the critical failure or satisfactory operating states of a circuit, as well as its possible incoherence.

The testing means MT comprises a gate $ET_8$ with an inverted output, whereof one input 32 inverts the level of the logic signal from output 22 of circuit C. The other input 33 of gate $ET_8$ is connected to an output of generator G and more specifically to an output 34 of synchronizing means SYN belonging to said generator and which make it possible to apply to said gate a pulse sync signal SYNC of logic level 1, whenever a simulation signal is applied to a component.

In the example of applying the system shown in FIG. 3 in connection with the investigation of sections of the circuit C corresponding to the circuit of FIG. 2A, outputs $QP_1$, $QP_2$, $QP_3$ of generator G are respectively connected to the simulation inputs 17, 19, 21 of gates $ET_1$, $ET_2$, $ET_3$ of circuit C. This generator, which will be described in greater detail hereinafter, makes it possible to apply to all the components, describing a section for example logic level 1 signals simulating their failure and logic level 0 signals simulating the satisfactory operation of the other components and then successively, to each components describing the section, a logic level 0 signal simulating the satisfactory operating states of said component, followed by a return to logic level 1, in order to observe whether at the output of the circuit, the return to the satisfactory operating state of one of the components does or does not maintain the circuit in the failure state.

If, during a test, one of the components is returned to the state of satisfactory operation and this also applies to the circuit, it is the studied section which is a critical section, the considered component then being a critical component, thich brings the circuit into a critical failure state.

Thus, on studying a section on circuit C or an identical circuit, the failure of said circuit results in a logic level 0 signal on output 22 of circuit C. Thus, a studied section on circuit C is critical for one component of said section, if the inverted output of gate $ET_8$ is returned to a logic level 1, when said component is returned to a satisfactory operating state (logic level 0 applied to the simulation input of the gate corresponding to the component). The considered component can then be called critical. This is e.g. the case of the components of the section corresponding to gates $ET_1$ and $ET_2$. Each of the two components of this section is critical and said section is of a minimum nature.

However, if during the simulation of one of the components of circuit C representing the satisfactory operation of said component (logic level 0 on the simulation input of the gate corresponding to circuit C), the output 22 of circuit C remains at logic level 0 and the output of gate $ET_8$ passes to logic level 0 during the application of signal SYNC, the component in question is not critical for the chosen section. Thus, the restoring of satisfactory operation of said component leaves the circuit in a failure state.

During tests, generator G applies to all the simulation inputs of the gates corresponding to the components of the section, a logic level 1 simulating a failure and then successively the simulation input of each component is brought to a logic level 0 simulating the satisfactory operating state of said component, then to logic level 1 again simulating the failure state. The simulation inputs of the other components corresponding to the section, during the simulation of a component, at a logic level 1 simulating the failure thereof.

For example, in circuit C of FIG. 2B, it is possible to investigate in the same way the existence of critical links, as well as critical components in said links.

In this application, the simulation inputs 24, 26, 28 of circuit C of FIG. 2B are respectively connected to outputs $QP_1$, $QP_2$, $QP_3$ of generator G, whilst output 29 of gate $ET_6$ is connected to input 32 of gate $ET_8$. In this example, operation is as follows. For example, logic level 1 signals representing the satisfactory operation of a component are applied to the simulation inputs 24, 28 of gates $ET_4$, $ET_6$, whereof the corresponding components constitute a link, and a logic level 0 signal to input 26 of gate $ET_5$ (representing the failure of the corresponding component), which does not form part of the link. Output 29 of gate $ET_6$ is then at logic level 1, which represents the satisfactory operating state of the simulated circuit or system. The output of gate $ET_8$ is then at logic level 1, when gate $ET_8$ receives the sync pulse on its input 33. If a logic level 0 is then applied to input 24 of gate $ET_4$ for representing the failure of the corresponding component, output 29 passes to logic level 0 (Failure state of the circuit). The output of gate $ET_8$ also passes to logic level 0 representing the failure of the circuit. The component simulated by gate $ET_4$ is consequently a critical component and the considered link is also critical. This link is also minimal, because it could be shown that the other component of the link, simulated by gate $ET_6$ is also critical. The circuit or system which has been simulated consequently has critical failure states.

During tests, the generator G applies to all the simulation inputs of the gates corresponding to the components of the link, a logic level 1 signal simulating their satisfactory operation and then successively the simulation input of each component is brought to a logic level 0 simulating the failure state of said component, then to a logic level 1 again simulating a satisfactory operating state. The simulation inputs of the other components corresponding to the link are, for the duration of the simulation of a component, at a logic level 1 simulating the satisfactory operation thereof.

The system according to the invention can also be used for investigating in the same way whether the circuit or system corresponding to the circuit of FIG. 2C for example is incoherent. In this case, the simulation inputs 101, 103, 105, 107 of the simulation circuit are respectively connected to outputs $QP_1$, $QP_2$, $QP_3$, $QP_4$ of generator G and output 108 of gate $OU_4$ is connected to input 32 of gate $ET_8$.

In this application, the generator G e.g. applies to the simulation inputs 103, 105, 107, logic level 0 signals simulating the satisfactory operation of the corresponding components, as well as a logic level 1 signal to input 101 simulating the failure of the corresponding component. Output 108 of $OU_4$ gate is at logic level 0 indicating the failure of the simulated circuit or system. The output of gate $ET_8$ of the testing means is then also at level 0, when input 33 of said gate receives the pulse SYNC.

If the generator then applies a logic level 1 signal to input 105 of gate $OU_3$ or to input 107 of gate $OU_4$ expressing the failure of the corresponding components, output 108 of gate $OU_4$ and output of gate $ET_8$ of the testing means pass to logic level 1 expressing the restoring of the satisfactory operating state to the simulated circuit or system. This circuit or system is incoherent because, being defective, the restoring to a failure state of a component which was in a satisfactory operating state returns the circuit to a satisfactory operating state. The component of the simulated circuit corresponding to gate $OU_4$ is an incoherent component. It will be shown hereinafter how the testing means make it possible to determine the critical sections, the critical links, the critical components and the incoherence on the basis of signals supplied by gate $ET_8$.

Generator G comprises a system P, whereof at least n flip-flops $P_1$, $P_2$, $P_3$, $P_i$... $P_n$ make it possible to store the logic simulation states of the components of the system or circuit to be investigated. The outputs $QP_1$, $QP_2$... $QP_i$... $QP_n$ of said flip-flops are, as stated hereinbefore, respectively connected to the simulation inputs of the components of the equivalent logic circuit C of the circuit or system to be investigated. Thus, in the considered example, outputs $QP_1$, $QP_2$, $QP_3$ are respectively connected to the simulation inputs 17, 19, 21 of the components of circuit C of FIG. 2A. In this case and as indicated hereinbefore, a section of order 3 is under investigation.

As will be shown in greater detail hereinafter, the logic states for simulating the failure or satisfactory operation of the components of circuit C are loaded into these flip-flops on initiating the system. The generator also comprises control means MC, whose outputs $QL_1$, $QL_2$, $QL_3$... $QL_n$ are connected to inputs of a logic system $EL_1$, $EL_2$ for the selection and control of the flip-flops $P_i$, so that the outputs of these storage flip-flops $P_i$ selected for simulating the given components of the circuits, have logic states 1 for simulating a failure and then so that each output successively has the reverse logic state (zero), simulating the satisfactory operation of the corresponding component or vice versa.

As will be shown hereinafter, these logic state changes on the outputs of the selected flip-flops $P_i$ are controlled by signals $MA_0$, $MA_1$ from synchronization means SYN. These signals are respectively applied to the logic systems $EL_1$ and $EL_2$. The control means MC comprise a shift register L, as well as the aforementioned synchronization means SYN. The shift register L has at least n control flip-flops $L_1$, $L_2$... $L_i$... $L_n$ connected in series. The outputs $QL_1$... $QL_i$... $QL_n$ of these flip-flops constitute control outputs of the storage system P for the logic simulation states. The first flip-flop $L_1$ of the shift register L has three inputs respectively connected to the outputs R, Q, C of synchronization means SYN. This flip-flop also receives a signal RAZL for resetting the content of the shift register, a signal $QL_0$ having a predetermined logic state which is stored, before shifting, in flip-flop $L_1$ of the register and a clock signal CL making it possible to control the shifts in register L of the signal $QL_0$ initially stored in flip-flop $L_1$. The control inputs of the selection logic system $EL_1$, $EL_2$ are respectively connected to the control inputs $QL_1$... $QL_i$... $QL_n$ of flip-flops $L_1$,... $L_i$... $L_n$. The outputs of this logic system are connected to control inputs $PR_1$... $PR_i$... $PR_n$, $CL_1$... $CL_i$... $CL_n$ of the flip-flops of system P. The logic system $EL_1$, $EL_2$ is constructed in such a way that each flip-flop $P_i$ which is selected in storage system P for applying a simulation signal to the simulation input of a predetermined component of circuit C corresponds to the presence of a predetermined logic level (logic level 1) on the control output $QL_i$ of the corresponding flip-flop $L_i$. This logic system also has two supplementary control inputs, which are respectively able to receive the test control signals $MA_0$, $MA_1$, so that the output of each selected flip-flop $P_i$ successively has the logic state of the flip-flop on initialization (logic state 1), the reverse state (logic state 0) of the initial state, then again the initial logic state 1 of said flip-flop, when studying a section.

The logic synchronization means SYN produce on their outputs signals SYNC for controlling the storage of the simulation results, signals RAZL for resetting the shift register L, as well as signals $QL_0$ and CL for storing and controlling the shift applied to the first flip-flop of register L. These synchronization means also produce on at output, a signal INIT making it possible to initialize a counter CPR of the testing means MT, which will be described hereinafter.

Counter CPR of testing means MT is loaded by an input CP, on initialization, with a value corresponding to the order of the section or link (value equal to 3 on e.g. considering the section constituted in FIG. 2A by gate $ET_1$, $ET_2$, $ET_3$). This counter has an input connected to an output of the synchronization means SYN for receiving an initialization signal INIT on initializing the system. The content of this counter decreases by one unit for each signal CL received on another input connected to an output C of the synchronization means SYN. One output of the counter is connected, as will be shown hereinafter, to a control input BL for stopping the synchronization means SYN, for the purple of stopping the system when all the components of the section or link have been simulated.

Finally, output 35 of gate $ET_8$ of the testing means MT is connected to one input of means 36, which makes it possible to indicate that a component of a section or link is critical. These means 36 can e.g. be constituted by a light indicator. They also have inputs 50 connected to outputs of another counter CPL which is used particularly for controlling the scanning of the simulation inputs of the tested circuit by logic level 0 or 1 signals. Counter CPL, which also forms part of the testing means MT has inputs, which are respectively connected to the outputs Q and C of the synchronization means SYN, for respectively receiving the resetting signal RAZL at the start of the testing of a circuit, together with the clock signals CL.

The logic selection and control system comprises two AND gate systems $EL_1$, $EL_2$, each having an inverted input. Each of these two systems respectively has a number of gates equal to the number n of flip-flops $P_i$ of the system P, as well as a number n of flip-flops $L_i$ of the shift register L. Each AND gate with an inverted output of the first logic system $EL_i$ has an input connected to a control output of the corresponding flip-flop $L_i$ and another input connected to the output $L_0$ of the synchronization means for receiving the test control signal $MA_0$.

Thus, input 38 of the first gate 39 of system $EL_1$ is connected to output $QL_1$ of register L, whilst the other inputs 40 of said gate receives the test control signal $MA_0$ from the synchronization means SYN. The outputs of the gates of this first logic system are respectively connected, after inversion, to one of the control inputs $CL_1$... $CL_i$... $CL_n$ of the flip-flops $P_i$ of system P. The flip-flops of system P are loaded on initializing the system. The logic level 1 signal $MA_0$ which, after passing into each gate of system $EL_1$ becomes a logic level 0 signal is successively applied to the control inputs $CL_1$, $CL_2$, $CL_3$ of the flip-flops of system P and passes these flip-flops to logic state 0, if their initial state was 1.

In the same way, each AND gate with an inverted input of the second logic system $EL_2$ has an input connected to a control output of the corresponding flip-flop $L_i$ of shift register L and another input connected to output $M_1$ of the synchronization means SYN for receiving the test control signals $MA_1$. The inverted outputs of these AND gates of the second logic system are respectively connected to the other control inputs $PR_1$. .. $PR_i$... $PR_n$ of the flip-flops of the system P for restoring these flip-flops to their initial state (logic level 1) during tests by means of signals $MA_1$.

Thus, for example, the first AND gate 41 of this second logic system has an input 42 connected to the first control output $QL_1$ of shift register L and another input 43, which receives a logic level 1 signal $MA_1$ when the flip-flop has to be brought into its initial again, i.e. logic state 1.

The storage flip-flops $P_i$ of the system P for storing the simulation logic state can e.g. be the flip-flops of the system P of the combined logic signal generator described in French patent application No. 8,101,392, filed on Jan. 26th 1981 by the present Applicant. In this case, the flip-flops were initially loaded by means of this combination generator, so that a predetermined arrangement of certain of them corresponding to the investigated section or link, has logic level 1 signals on its outputs.

In the testing system described hereinbefore, successive flip-flops of the system P, correspond in each case to components describing the section or link. It is obvious that other flip-flops $P_k$ can be inserted between flip-flops $P_i$ to act on other, not shown components, whose marks do not correspond to those of the studied section or link. Thus, it is possible to obtain a system P of flip-flops, arranged from 1 to n, in which n represents the total number of components of a circuit. During simulations of different components of circuit C, whereof it is wished to study a section for example, output 22 of said circuit is at logic level 0, if the latter is defective.

During the simulations of the various components. of a section of circuit C, if it is found that the restoring of a satisfactory operating state to one of the components, by applying a logic level 0 signal to the defective input thereof restores circuit C to a state of satisfactory operation, the output of said circuit passes to logic level 1. At the time of applying pulse SYNC to gate $ET_8$, at the output of said gate a logic level 1 signal appears, which then indicates that the investigated section is a critical section.

The system operates differently in the investigation of a section depending on whether the marks on defective components and consequently the positions of the logic levels 1 on the outputs of the storage system P are known or whether these marks, together with the positions of the logic levels 1 on the outputs of the storage system P are unknown. On initializing the system and in both cases the outputs of these registers P for storing the logic simulation states connected to the simulation inputs of the components of circuit C in FIG. 2A for example, are at logic level 1 for all the components corresponding to the section and at logic level 0 for all the other components. A logic level 0 is present on output 22 of circuit C. The section represented by $ET_1$ and $ET_3$ is e.g. critical. The successive simulations of the satisfactory operating states on each of the simulation inputs of the components of the section must bring about at least once the appearance of a logic level 1 signal on output 22 of the circuit. As stated hereinbefore, in said section, the component corresponding to gate $ET_3$ is a critical component. Thus, the restoring to a state of satisfactory operation of said component (logic level 0 on input 21 of $ET_3$) returns the circuit to a satisfactory operating state.

Thus, the testing system according to the invention operates in the following way in the case of the circuit C shown e.g. in the drawings and in the case of studying the section $ET_1$, $ET_2$, $ET_3$ of order 3. The simulation inputs 17, 19, 21 of gates $ET_1$, $ET_2$, $ET_3$ are initially at logic level 1 simulating the failure of these components, so that input 17 of gate $ET_1$ will be brought to logic level 0 simulating the satisfactory operating state of said gate, whilst the other simulation inputs of the two other gates remain at logic level 1. The simulation of the satisfactory operating state of gate $ET_1$ changes nothing on output 22 of circuit C or on output 35 of gate $ET_8$, which remains at logic level 0 at the time of pulse SYNC. The component corresponding to gate ET$_1$ is consequently not critical. On carrying out the same type of simulation for gate ET$_2$, it is found that the component corresponding to said gate is not critical. The only critical component in the considered section is that corresponding to gate ET$_3$.

The same operations could obviously be carried out on a circuit representing the link, e.g. identical to the circuit of FIG. 2B. If the components corresponding to gates ET$_4$ and ET$_6$ constitute a link of order 2 and the component corresponding to gate ET$_5$ is defective (logic level 0 on its simulation input, it can be seen that the simulated circuit is in a failure state if one of the components corresponding to gate ET$_4$ or to gate ET$_6$ is brought into a failure state (logic level 0 on the simulation input of one of these gates). Under these conditions, it can be said that is components are critical for the considered links. When each of these components is brought into the failure state, the output of gate ET$_{10}$ passes to logic level 0 at the instant of pulse SYNC, thus indicating a failure state.

The link is critical and of a minimum nature. The investigation of the incoherence of a circuit takes place in a similar way, e.g. with the aid of the circuit of FIG. 2C. This study was described hereinbefore.

In the embodiment of the system according to the invention shown in FIG. 3, it is assumed that the marks and consequently the positions of the flip-flops of system P at level 1 are known. In this case, on initialization, register L is reset by a resetting signal applied to input RAZL of register L, thus controlling the resetting of all the flip-flops L$_i$. A logic level 1 storage signal is then applied to the storage input QL$_0$ shift register L, as the same time as a pulse CL bringing about a logic state 1 of the first flip-flop L$_1$, whilst all the oer flip-flops of shift register L are at logic level 0. This operation makes it possible to insert a single logic level 1 into register L (in the flip-flop L$_1$). Via the first flip-flop of logic system EL$_1$ and the first flip-flop of logic system EL$_2$, this operation makes it possible to simulate the first component of circuit C by applying signal MA$_0$ to the input 40 of gate 39, which passes output QP$_1$ of flip-flop P$_1$ of system P to logic level 0, thus simulating the satisfactory operation of the first component ET$_1$ in the case of a section. If this simulation of the satisfactory operation leads to the appearance on output 22 of circuit C of a logic level 1 representing the satisfactory operation of this circuit, it means that the section is critical and the simulated component is a crtical component. Another shift pulse is then applied to input CL of shift register L, whilst input QL$_0$ is raised to logic level 0. This new pulse applies to input CL of the shift register transferred level 1, which was contained in flip-flop L$_1$, into flip-flop L$_2$ to permit the simulation of the component corresponding to gate ET$_2$ via flip-flop P$_2$.

It is obvious that this level is transferred to flip-flop L$_i$ of shift register L to pemit the simulation of the component of rank i, via flip-flop P$_i$.

It is also obvious that if the components of rank i describing a section or a link do not correspond to the successive flip-flops P$_i$, it is necessary to transfer the level 1 into register L in front of each of the flip-flops P corresponding to the components describing the section.

It is so obvious that after the simulation of the satisfactory operation of component ET$_1$, flip-flop P$_1$ of system P is restored to the initial state of level 1 through the application of signal MA$_1$ to the first gate of logic system EL$_2$, flip-flop P$_1$ having been places at zero by applying signal MA$_0$ to the first gate of logic system EL$_1$. The application signals MA$_0$ and MA$_1$ is repeated for a number of times equal to that of the components constituting the section or links.

The operation of the testing means MT will now be explained in greater detail for the investigation of itical components of the section or link, as well as for the investigation of an incoherent circuit or system.

In the case of investigating the critical component or components of a section, the testing means MT function in the following manner. A logic level 1 is introduced, as stated hereinbefore, into register L. This logic level 1 is then shifted so that the flip-flop L, whose output is at the logic level, faces one of the flip-flops of register P, which is connected to the simulation input of the gate corresponding to the first component describing the section for example. This logic level 1 makes it possible to simulate a failure of the corresponding component. This logic level 1 is then eliminated and replaced by a logic level 0 simulating the satisfactory operation of the corresponding component. The synchronization means SYN then supply a pulse SYNC. If output 35 of gate ET$_8$ is at logic level 1, then the corresponding component is a critical component. The number of this critical component can be known through a counter CPL, which is reset when register L has been reset by signal RAZL, supplied to output Q of synchronization means SYN. Counter CPL is incremented by one unit whenever the logic level 1 is shifted in register L by applying a pulse CL thereto from output C of synchronization means SYN. The indication means 36 then indicates that it is a critical component and the information supplied to the inputs 50 of said means 36 by counter CPL indicate the number of the critical components. When a component has been tested in this way (whether critical or not), said component is then restored to a failure state (logic level 1 on its simulation input).

Logic level 1 is then shifted in register L, in such a way that it faces one of the outputs of the flip-flops of register P, which is connected to a simulation input of the component along said section. The indication means 36, counter CPR and counter CPL then act in the manner indicated hereinbefore if said other component is critical. This procedure is continued until all the simulation inputs of circuit C have been scanned by logiclevels 1, i.e. until the value loaded into counter CPR on initialization (order of the section) is reached. Counter CPR then stops the scanning by an output signal aied to the input BL of the synchronization means SYN. A similar operation could be described for the investigation of the critical component or components of a link.

In the case where the system according to the invention is used for determining the incoherent components of a circuit and more particularly a given section of said circuit, it functions as follows. The operation is very similar to that used when the system is employed for determining the critical components, except that in the case of determining incoherent components, register L supplies a logic level 1 signal on one of its outputs and by shifting stops facing a flip-flop of register P, whose output signal is at logic level 0 (in the investigation of critical components, said logic level 1 signal would be stopped, by shifting, in front of a flip-flop of register P, whereof the output signal was at logic level 1). The logic level 0 signal supplied on the simulation input of a gate corresponding to a component of the circuit whose section is being investigated, then brings the corresponding component into a failure state, because the simulation input passes to logic level 1. A synchronization pulse SYNC supplied by the synchronization means SYN is then applied to gate $ET_8$. If the signal on output 35 of said gate then passes to logic level 1, it is because the component in question is incoherent for the section. The number of the component can be known as a result of counter CPL. This component is then restored to a satisfactory operating state and the shifting of level 1 then takes place on the outputs of register L, up to the next flip-flop of register P, whose output is at logic level 0. This is recommenced until a complete scan has taken place of all the outputs of register P, which are at logic level 0.

In order to know whether all the components of the tested circuit have been scanned, use is made of counter CPR, which is loaded by the total number of components. This counter is decremented by one unit whenever it receives a pulse CL from output C of synchronization means SYN. These pulse CL also make it possible to carry out shifts in register L.

Figure 4:
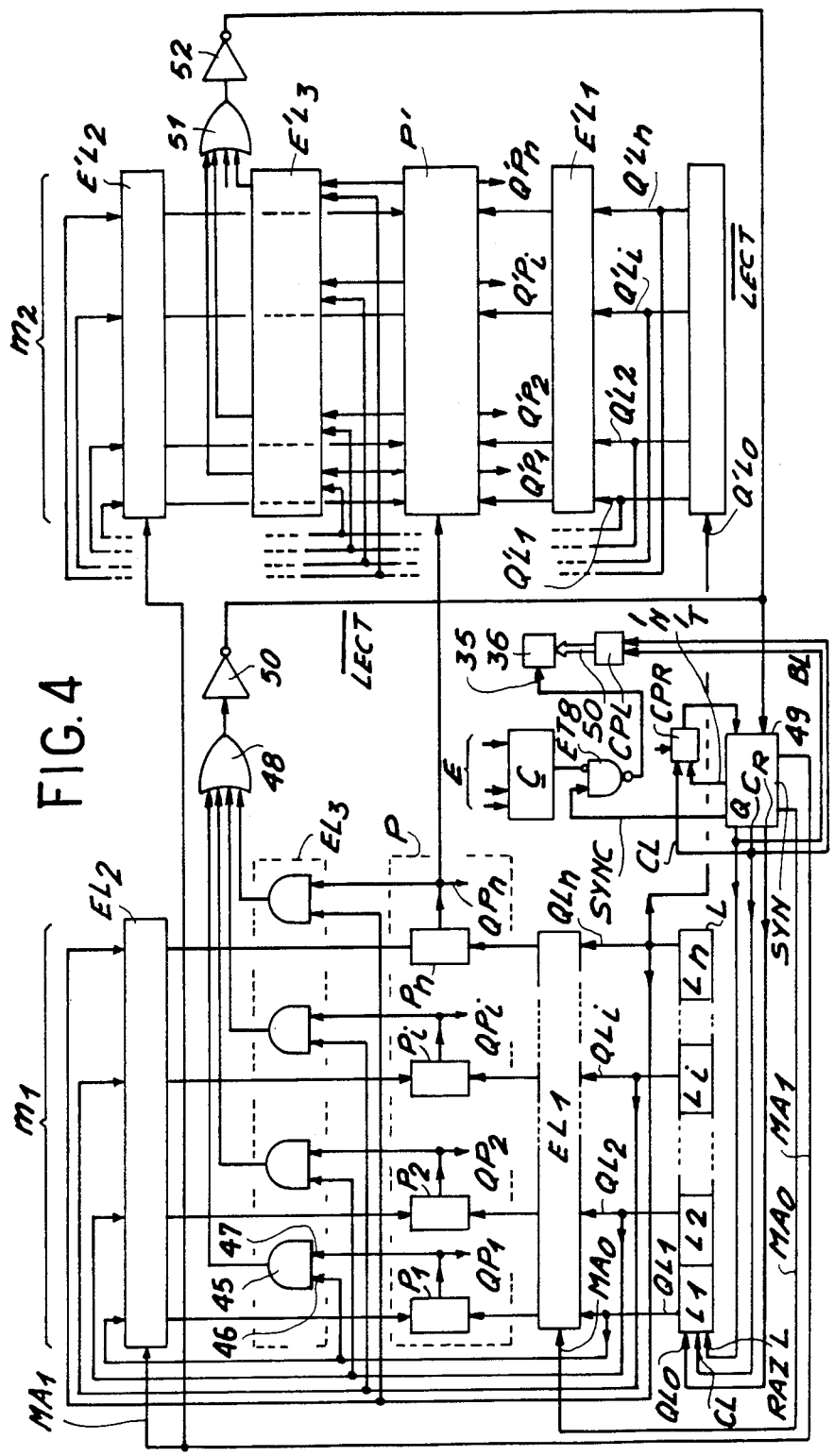
FIG. 4 diagrammatically, another embodiment of the system according to the invention in modular form.

FIG. 4 diagrammatically shows two other embodiments of a system according to the invention. One of these embodiments relates to the case where the position of the flip-flops of the storage system P at logic level 1 is unknown. Another embodiment is shown in the same drawing and relates to the case where the position of the flip-flops of system P at logic level 1 is unknown, so that the system is constructed in modular form. The same elements carry the same references as in the previous drawing.

In the embodiment shown in the left-hand part thereof, the system according to the invention comprises flip-flops $P_1$, $P_2$... $P_n$ of the storage system P supplying on their outputs signal $QP_1$, $QP_2$... $QP_i$... $QP_n$. It also comprises the logic system $EL_1$ and $EL_2$ receiving signal $MA_0$ and $MA_1$ making it possible to control the logic state changes of the predetermined outputs of the flip-flops of system P. It also comprises shift register L, formed from flip-flops $L_1$, $L_2$... $L_i$... $L_n$, which resepctively receive on their inputs a storage signal $QP_0$, shift control signal CL and a resetting signal RAZL.

It is also possible to see therein, the synchronization means SYN controlling the shift register L, which supplies signal $MA_0$ and $MA_1$, together with signals SYNC and INIT. Simulation circuit C receives on its inputs E, the predetermined output signals from the flip-flops of system P. As stated hereinbefore, counter CPR supplies the blocking signal BL of synchronization means SYN. Finally, the means indicating that the section or link is critical or that the circuit or system is incoherent are shown at 36.

In this embodiment, the system functions in the same way as hereinbefore, except with respect to the selection of the flip-flops of storage system P. This system makes it possible to simulate circuit C on inputs E. Thus, if the flip-flops $P_i$ corresponding to the components describing a section for example are at logic level 1 making it possible to simulate the inputs of circuit C and are mixed with flip-flops $P_k$ at a logic level 0 and if the position of flip-flops $P_i$ of system P is unknown, it is necessary to manage this shift register L in a different manner from that described hereinbefore.

In this case, the logic control system also comprises a third logic system $L_3$ of the AND gate. Each of these gates has an input connected to the control output of the corresponding flip-flops $L_i$ in shift register L and another input connected to the output of the corresponding flip-flops $P_i$ in the storage system P. Thus, for example, the AND gate 45 of logic system $E_3$ has an input 46 connected to output $QL_1$ of flip-flop $L_1$ of shift register L and an input 47 connected to output $QP_1$ of flip-flop $P_1$ of system P. The outputs of the gates of logic system $EL_3$ are connected to the inputs of an OR gate 48, whose output is connected to an input 49 of the synchronization means SYN, via an inverter 50. The output of the latter applies a signal $\overline{LECT}$ to input 49 of synchronization means SYN also under conditions to be defined hereinafter.

In this embodiment, the system functions as follows. A single logic level 1 is transferred into register L. In order to e.g. investigate whether the logic state of flip-flop PM of rank P between 1 and n is 1, a logic level 1 is transferred into register L up to flip-flop LM. The corresponding AND gate of logic system $EL_3$, whose inputs are respectively connected to output $QP_m$ of flip-flop $P_m$ and to output $QL_m$ of flip-flop $L_m$ of shift register L validates the transmission of the output logic level 1 of flip-flop $P_m$ to circuit SYN by means of a signal $\overline{LECT}$ which then appears on the output of inverter 50, which is connected to input 49 of synchronization means SYN. On receiving signal $\overline{LECT}$ these synchronization means initiaite the validation of signal $MA_0$ and then that of signal $MA_1$, said signals being successively applied to the inverted output AND gates, which correspond to flip-flop $P_m$ in logic systems $EL_1$ and $EL_2$.

Initially, flip-flops $P_1$, whose outputs correspond to the section or link to be investigated (to investigate the possibly critical or incoherent components therefore) are brought to logic level 1, e.g. with the aid of the combined logic signal generator described in the aforementioned French patent application. Counter CPR is loaded with the order of the section, ie. 3, simulated by a circuit having gates $ET_1$, $ET_2$, $ET_3$. A logic level 1 is then injected onto input $QL_0$ of flip-flop $L_1$ after resetting shift register L by means of a resetting signal applied to its input RAZL. If signal $\overline{LECT}$ is at logic level 0, the flip-flop $P_1$ corresponding to the flip-flop $L_1$ of the shift register has a logic level 1 on its output $QP_1$.

In the opposite case, pulses CL are applied to the shift control input of shift register L. Each of these pulses is followed by a test of signal $\overline{ECT}$. If at the end of a test, said signal is at level 1, a further pulse is supplied to input CL of the shift register, until signal $\overline{LECT}$ is at logic level 0, thus indicating the presence of a logic level 1 on an output of a flip-flop of the storage system P corresponding to the flip-flop which is at level 1 in register 1. Whenever a logic level 1 is found on output $QP_i$ of the storage system P, signal $MA_0$ and $MA_1$ are successively applied to the inputs of logic signals $EL_1$ and $EL_2$. All these operations are repeated until the counter CPR initially loaded with the value of the order of the section is at 0.

Thus, when this counter is at zero, all the components of the section or linkhave been simulated. The same operations would be carried out in the case of a link like that shown e.g. in FIG. 2B. Counter CPL is once again used for marking a critical component.

FIG. 4 also shows another embodiment of the system according to the invention, in which the system functions in the same way. The system is in this case in modular form and all that is shown are two modules $M_1$ and $M_2$, but it is obvious that it would be possible to have more modules. The storage flip-flops $P_i$ are grouped into identical systems P, P'. . . connected in series, in such a way that the final flip-flop $P_m$ of the first module P is connected to the input of the first flip-flop of system P' of the second module $m_2$. The modules comprise shift registers L, L'. . . which are of an identical nature. The shift register of the first module $m_1$ comprises inputs for the storage, resetting and shift control purposes $QL_0$, RAZL and CL, whilst the control output $QL_n$ of the final flip-flop of the shift register L of the first module $m_1$ is connected to the storage input $Q'L_0$ of shift register L' of the following module. Modules $m_1$ and $m_2$ respectively have first, second and third logic systems $EL_1$, the flip-flops of the storage system P' of the second module $m_2$ being represented at $Q'P_1$, $Q'P_2$. . . $Q'P_i$. . . The control outputs of the shift register L of said second module are shown at $Q'L_1$. . . $A'L_i$. . . $Q'L_n$. They are connected to the inputs of logic systems $E'L_1$, $E'L_2$, $E'L_3$. The outputs of the third logic system $E'L_3$ of the second module $m_2$ are connected to the inputs of the OR gate 51, whose output is connected to the control input 49 of synchronization means SYN via the amplifier-inverter 52, comparable to amplifier-inverter 50 and via the bus line.

As hereinbefore, the output of amplifier 52 supplies a signal $\overline{LECT}$ whenever a level 1 is found on output $Q'P_i$ of a flip-flop $P'_i$ of a system P', as a result of the presence of a level 1 on the corresponding output $Q'L_i$ of a flip-flop $L'_i$ of shift register L'.

Thus, this modular construction makes it possible to have a larger number of simulation signals, when a circuit or system having a very large number of components has to be investigated. Each of the amplifiers 50 and 52 is constituted by a transistor connected as an open collector (known in the art and described in the aforementioned French patent application).

What is claimed is:

1. A system for testing the failure or satisfactory operation of a circuit having logic components, in which n components for a system of components marked 1 to n in a predetermined manner and interconnected to that said system has on one output a logic state corresponding to the failure or satisfactory operation state of the system and which depends on the failure or satisfactory operating state of each of the n components of the system, each of the n components of the system having at least one simulation input able to receive a signal simulating the failure or satisfactory operation of said system, comprising:

a generator whose outputs are respectively connected to the simulation inputs of the components these generator outputs providing simulation signals having a first or a second logic state making it possible to bring one or more components respectively into the failure or satisfactory operation state and then conversely and reciprocally bringing said component or components into a satisfactory operation or failure state, for one or more combinations from among the n components of the system;

testing means connected to the output of the system and able to mark the logic level of the output signal of the system, these testing means comprising:

a counter having a loading input for loading a predetermined value corresponding to numbers of components to be simulated in the tested circuit, said counter having another input connected to an output of the generator for receiving an initialization signal on initializing the generator, and another input connected to an output of the generator providing a control pulse for controlling the countdown of said counter, an output of said counter being connected to a stop control signal input of the generator for providing a signal to the generator when all the components have been simulated;

another counter connected to an output of the genertor for receiving a resetting signal, on initializing the generator and another input connected to the generator output for receiving such control pulse for controlling the incrementation of the counter content;

means for marking the logic level of the output signal of the system said means connected to the system output and to an output of the generator for receiving a synchronizing signal for each new combination of simulation signals, and connected to an output of said counter for marking the number of any component for which the change of logic level of the simulation signal applied thereto beings about a change of level of the output signal of the system.

2. A testing system according to claim 1, wherein the marking means comprises:

an AND gate with an inverted input connected to the output of thre system, and another input connected to the output of the generator supplying said synchronizing signal, and a number display means having one input connected to the output of the AND gate and another input connected to the output of said other counter, the display means indicating the number or numbers of so-called critical components for which the simulation of a satisfactory operation brings about a change in the level of the output signal of the circuit, which then corresponds to the satisfactory operation of the circuit;

the display means indicating the number or numbers of so-called critical components for which the simulation of a failure brings about a change in the level of the output signal of the circuit, which then corresponds to the failure of the circuit;

the display means indicating the number or numbers of said other component or components, called incoherent components, for which the simulation of a failure brings about a change of level of the output signal of the system, which then corresponds to the satisfactory operation of the system.

* * * * *